United States Patent
You

(10) Patent No.: US 7,212,451 B2
(45) Date of Patent: May 1, 2007

(54) COLUMN SELECTION SIGNAL GENERATOR OF SEMICONDUCTOR MEMORY DEVICE

(75) Inventor: Min Young You, Chungcheongbuk-do (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 56 days.

(21) Appl. No.: 11/148,561

(22) Filed: Jun. 9, 2005

(65) Prior Publication Data

US 2006/0209602 A1 Sep. 21, 2006

(30) Foreign Application Priority Data

Mar. 18, 2005 (KR) ...................... 10-2005-0022578

(51) Int. Cl.
*G11C 7/06* (2006.01)
*G11C 7/00* (2006.01)

(52) U.S. Cl. .................................. 365/191; 365/189.07
(58) Field of Classification Search ................ 365/191, 365/189.07, 233, 189.02, 230.06
See application file for complete search history.

(56) References Cited

U.S. PATENT DOCUMENTS

| 5,803,527 A | * | 9/1998 | Fujiya | ........................... 296/93 |
| 5,959,936 A | * | 9/1999 | Seo et al. | .................... 365/233 |
| 6,178,501 B1 | * | 1/2001 | Ingalls | ........................... 713/1 |
| 6,292,430 B1 | * | 9/2001 | Ohtake et al. | ............... 365/233 |

FOREIGN PATENT DOCUMENTS

| KR | 1020010002498 A | | 1/2001 |
| KR | 10-2004-0056787 | * | 7/2004 |
| KR | 1020040056787 A | | 7/2004 |

* cited by examiner

*Primary Examiner*—Son Dinh
*Assistant Examiner*—Douglas King
(74) *Attorney, Agent, or Firm*—Heller Ehrman LLP

(57) ABSTRACT

A column selection signal generator of a semiconductor memory device is configured to maintain a predetermined pulse width of a column selection signal regardless of change in process and external conditions by selectively using a self-generated pulse signal and a pulse signal generated by an external clock signal. The column selection signal generator includes a command combination unit, a pulse generating unit, a comparison unit and a selection unit.

7 Claims, 4 Drawing Sheets

COLUMN SELECTION SIGNAL GENERATOR OF SEMICONDUCTOR MEMORY DEVICE

BACKGROUND OF THE INVENTION

1. Field of the Invention

The present invention generally relates to a column selection signal generator of a semiconductor memory device, and more specifically, to a technology of maintaining a predetermined pulse width of a column selecting signal regardless of change of process and external conditions by selectively using a self-generated pulse signal and a pulse signal in response to an external clock signal as a column selection signal.

2. Description of the Related Art

In general, a semiconductor memory device, which stores data in a plurality of cells or reads stored data, comprises a plurality of word lines, a plurality of bit lines, a circuit for selecting the word line and the bit line, a plurality of sense amplifiers, and a row decoder and a column decoder for selecting the cell.

Specifically, the column decoder decodes a column address to output a column selection signal to select a bit line. Here, a pulse width of the column selection signal means a transmission time of data in the sense amplifier to a data bus at a read mode.

As a result, as the pulse width of the column selection signal becomes smaller, the speed of the semiconductor memory device is improved. However, when the pulse width is too small, a time for sufficiently transmitting data is not secured, which causes defects. Therefore, it is important to secure a column selection signal having a proper pulse width.

FIG. 1 is a diagram illustrating a conventional column selection signal generator of a semiconductor memory device. The conventional column selection signal generator comprises a command combination unit 10, a pulse generating unit 20 and a driving unit 30.

The command combination unit 10 comprises inverters IV1~IV3, and a NAND gate ND1. Each of the inverters IV1~IV3 inverts an internal read command signal IRD, an internal write command signal IWT and an internal column address selection signal ICAS, respectively. The NAND gate ND1 performs a NAND operation on output signals from the inverters IV1~IV3 to output a pulse signal OUT2. Here, the internal read command signal IRD, the internal write command signal IWT and the column address ICAS are signals based on an external clock signal. The internal read command signal IRD is enabled at a read command, and the internal write command signal IWT is enabled at a write command. The command combination unit 10 outputs the pulse signal OUT2 in response to the internal read command signal IRD/internal write command signal IWT when a first address is applied at the read/write commands, and in response to the internal column address selection signal ICAS when a second address is applied.

The pulse generating unit 20 self-generates a pulse signal OUT1. The pulse generating unit 20 comprises a RC delay unit, a plurality of inverter delay units, a plurality of NAND gates, a plurality of inverters and a switching element. That is, the pulse generating unit 20 delays the pulse signal OUT2, and then latches the delayed signal through a latch unit which comprises the plurality of NAND gates or feeds the delayed signal back to the delay unit. Here, a pulse width of the pulse signal OUT1 is determined by delay of the plurality of delay units in the pulse generating unit 20, which are embodied with a RC circuit and an inverter chain.

The driving unit 30, which comprises inverters IV4 and IV5 connected serially, drives the pulse signal OUT1 outputted from the pulse generating unit 20 to output a column selection signal YSP. The column selection signal YSP determines a time and a period to enable a main amplifier (not shown) for amplifying data of a selected column and a main output driver (not shown.)

For example, when the column selection signal YSP generated by the internal read command signal IRD is enabled, the main amplifier (not shown) is enabled while the column selection signal YSP is enabled. Thereafter, when the column selection signal YSP is disabled, the main output driver (not shown) is enabled to determine a time for externally transmitting data of a memory cell depending on a pulse width of the column selection signal YSP. As a result, the column selection signal YSP is required to have a proper pulse width so as to sufficiently transmit the data of the memory cell to the outside.

However, the conventional column selection signal generator uses as the column selection signal YSP the pulse signal OUT1 outputted by the pulse generating unit 20 comprising a R-C delay unit (not shown). Here, since the R-C delay unit (not shown) is sensitive to change of external conditions such as process change and temperature change, the pulse width of the pulse signal OUT1 is changed depending on the change of the external condition, so that the pulse width of the column selection signal YSP is changed.

SUMMARY OF THE INVENTION

Accordingly, it is an object of the present invention to maintain a predetermined pulse width of a column selection signal by controlling a pulse signal generated by an external clock signal to be used as a column selection signal when a pulse width of a column pulse generating signal is changed by external conditions such as process change or temperature change.

In an embodiment, a column selection signal generator of a semiconductor memory device comprises a command combination unit, a pulse generating unit, a comparison unit and a selection unit. The command combination unit logically combines a plurality of command signals in response to an external clock signal to generate a first pulse signal. The pulse generating unit generates a second pulse signal in response to the first pulse signal. The comparison unit compares a pulse width of the first pulse signal with that of the second pulse signal to output a column selection signal in response to the comparison result. The selection unit selectively outputs one of output signals from the comparison unit and the pulse generating unit.

BRIEF DESCRIPTION OF THE DRAWINGS

Other aspects and advantages of the present invention will become apparent upon reading the following detailed description and upon reference to the drawings in which.

DETAILED DESCRIPTION OF THE PREFERRED EMBODIMENTS

The present invention will be described in detail with reference to the accompanying drawings.

Figure 1:
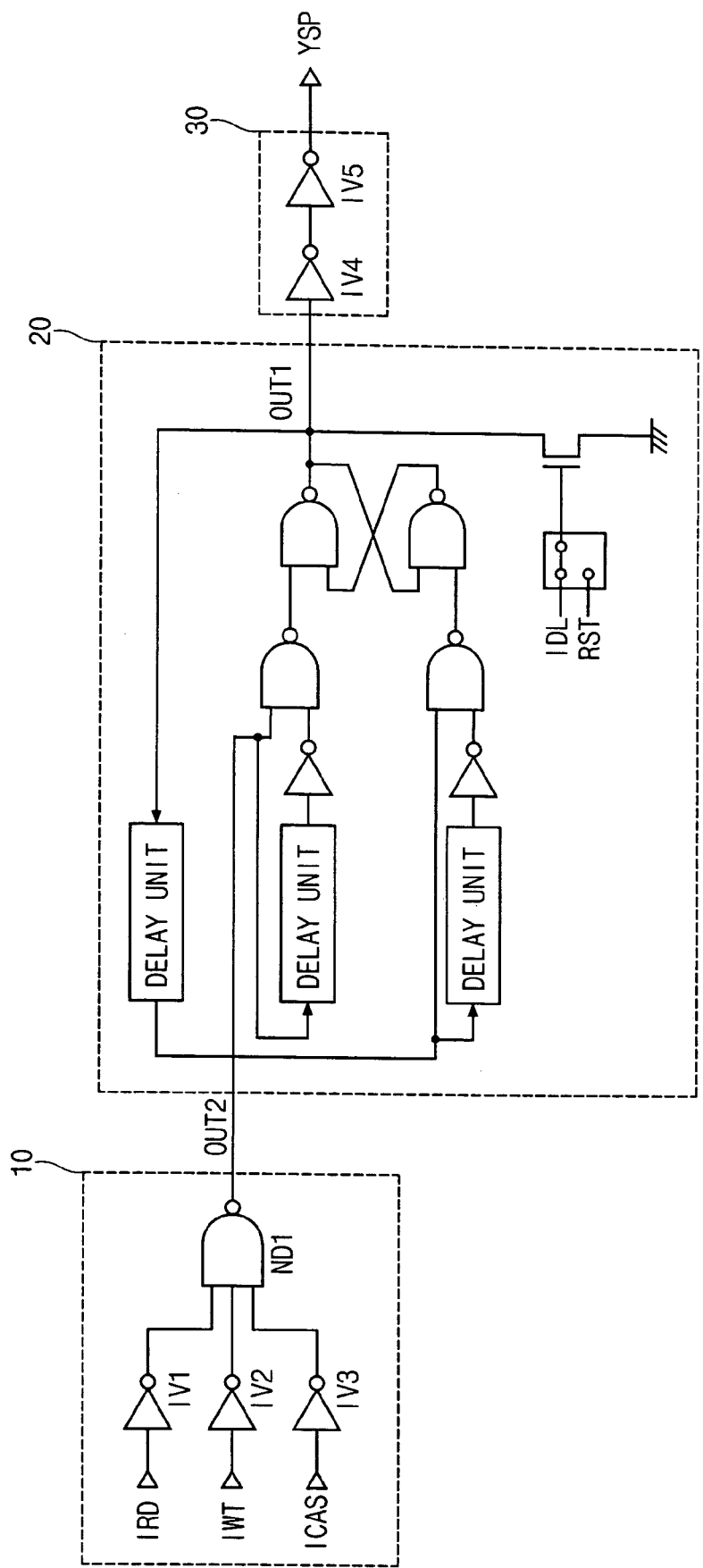
FIG. 1 is a diagram illustrating a conventional column selection signal generator of a semiconductor memory device.
Figure 2:
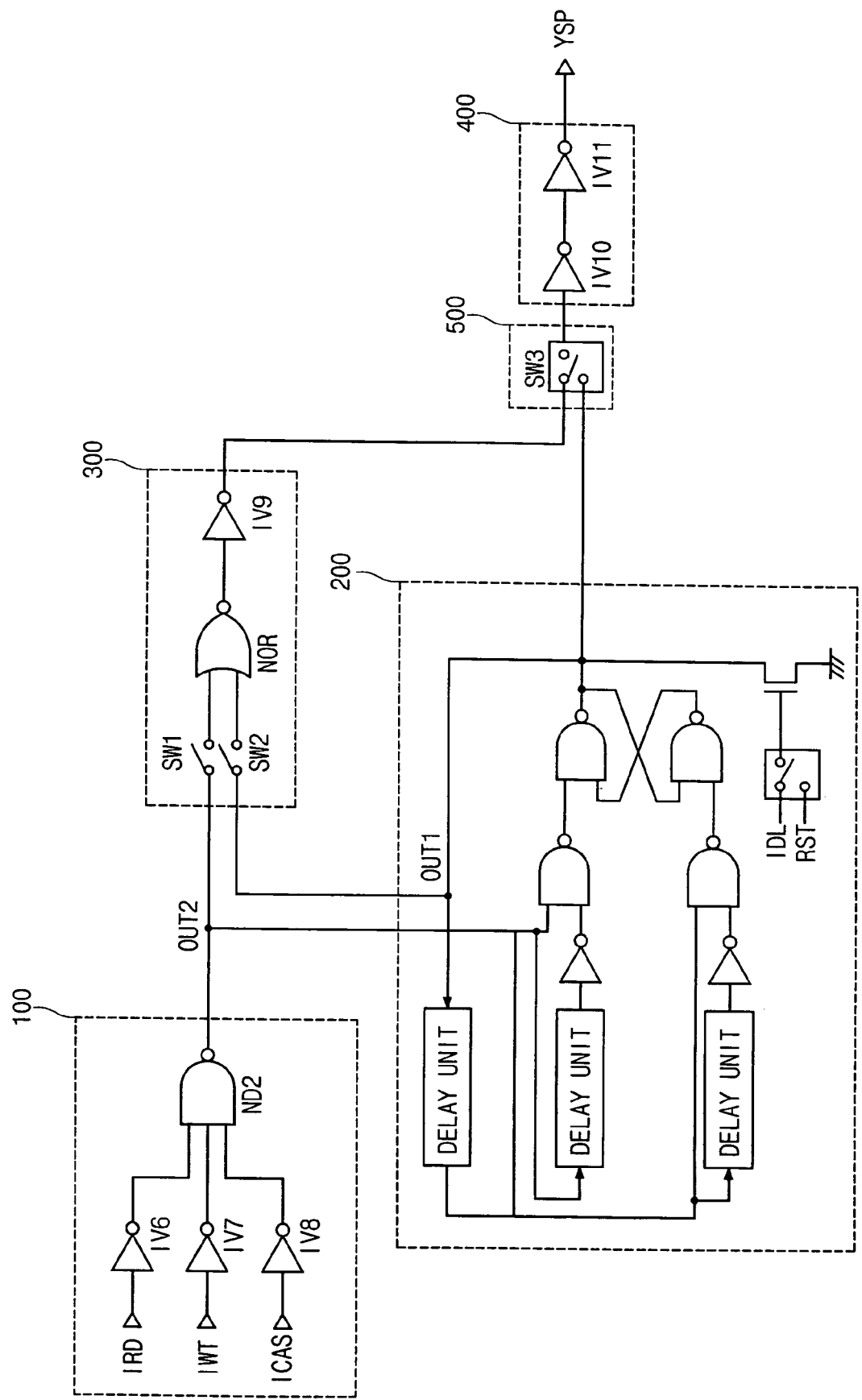
FIG. 2 is a diagram illustrating a column selection signal generator of a semiconductor memory device according to an embodiment of the present invention.

FIG. 2 is a diagram illustrating a column selection signal generator of a semiconductor memory device according to an embodiment of the present invention.

In an embodiment, the column selection signal generator comprises a command combination unit 100, a pulse generating unit 200, a comparison unit 300 and a driving unit 400.

The command combination unit 100 comprises inverters IV6~IV8, and a NAND gate ND2. Each of the inverters IV6~IV8 inverts an internal read command signal IRD, an internal write command signal IWT and an internal column address selecting signal ICAS, respectively. The NAND gate ND2 performs a NAND operation on output signals from the inverters IV6~IV8 to output a pulse signal OUT2. Here, the internal read command signal IRD, the internal write command signal IWT, the internal column address selecting signal ICAS are signals based on an external clock signal.

The pulse generating unit 200 outputs a pulse signal OUT1 in response to the pulse signal OUT2 of the command combination unit 100. The pulse generating unit 200 comprises a plurality of delay units, a plurality of NAND gates, a plurality of inverters and a switching element. That is, the pulse generating unit 200 delays the pulse signal OUT2, and then latches the delayed signal through a latch unit which comprises the plurality of NAND gates or feeds the delayed signal back to the delay unit. Here, a pulse width of the pulse signal OUT1 is determined by delay of the plurality of delay units in the pulse generating unit 200, which are embodied with a RC circuit and an inverter chain.

The comparison unit 300 compares the pulse signals OUT1 and OUT2 to output the comparison result. The comparison unit 300 comprises switching elements SW1, SW2, a NOR gate NOR and an inverter IV9. The switching elements SW1 and SW2 selectively transmit the pulse signals OUT1 and OUT2 into an input terminal of the NOR gate NOR. The NOR gate NOR performs a NOR operation on the pulse signals OUT1 and OUT2. The inverter IV9 inverts an output signal from the NOR gate NOR.

The selection unit 500, which comprises a switching element SW3, directly outputs the output signal OUT1 of the pulse generating unit 200 to the driving unit 400 or outputs an output signal of the comparison unit 300 to the driving unit 400. The selection unit 500 is comprised when the output signal OUT1 of the pulse generating unit 200 is directly outputted not through the comparison unit 300. Here, the switching element SW3 can be embodied in various ways such as metal option.

The driving unit 400, which comprises inverters IV10 and IV11 connected serially, drives an output signal from the comparison unit 300.

Figure 3:
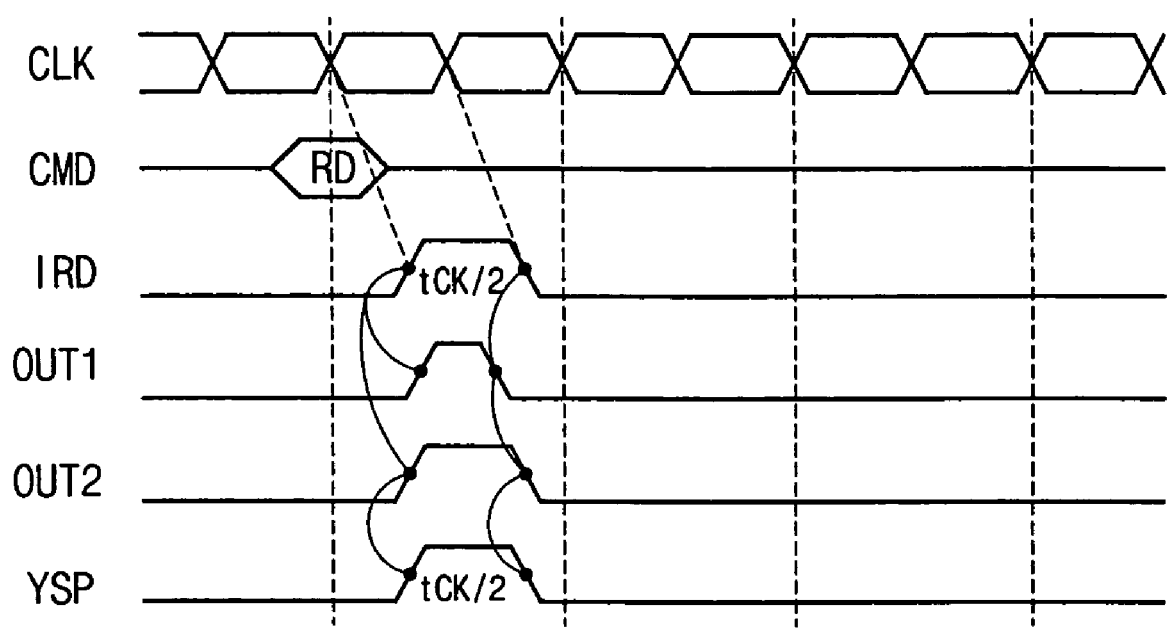
FIGS. 3 and 4 are waveform diagrams illustrating the read mode of the column selection signal generator of FIG. 2 which controls a column selection signal.
Figure 4:
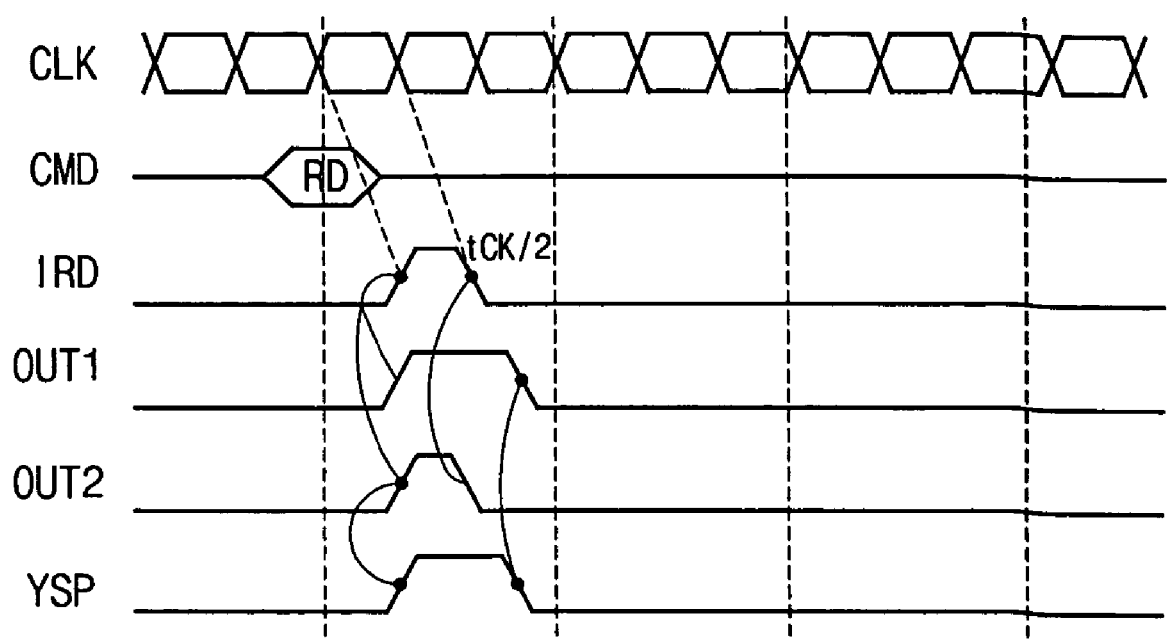

Referring to FIGS. 3 and 4, the operation for maintaining a predetermined pulse width of a column selection signal is described.

The internal read command signal IRD is enabled at a read mode, and the internal write command signal IWT is enabled at a write mode. The command combination unit 100 outputs the pulse signal OUT2 in response to the internal read command signal IRD and the write command signal IWT. The pulse generating unit 200 outputs a pulse signal OUT1 having a predetermined pulse width using a R-C delay unit (not shown). The comparison unit 300 compares the pulse signals OUT1 and OUT2 to select one having a larger pulse width, and outputs the signal as a column selection signal YSP.

FIG. 3 shows when a tCK (clock period) is long at the read command, and FIG. 4 shows when the tCK (clock period) is short at the read command.

As shown in FIG. 3, when the tCK is long, if the internal read command signal IRD is applied, the pulse signal OUT2 of the command combination unit 100 becomes identical with the pulse width of the internal read command signal IRD. Thereafter, the pulse generating unit 200 outputs the pulse signal OUT1 in response to the pulse signal OUT2. The comparison unit 300 compares the pulse signals OUT1 and OUT2, and outputs the column selection signal YSP by the pulse signal OUT2 having a larger pulse width than that of the pulse signal OUT1.

As shown in FIG. 4, when the tCK is short, if the read command signal IRD is applied, the pulse signal OUT2 of the command combination unit 100 becomes identical with the pulse width of the internal read command signal IRD. Thereafter, the pulse generating unit 200 outputs the pulse signal OUT1 in response to the pulse signal OUT2. The comparison unit 300 compares the pulse signals OUT1 and OUT2, and determines the pulse width of the column selection signal YSP by the pulse signal OUT1 having a larger width than that of the pulse signal OUT2.

In the column selection signal generator according to an embodiment of the present invention, the pulse signal obtained by combination of the internal read command signal IRD, the internal write command signal ICAS and the internal column address selecting signal CAS using the external clock signal is compared with that of the internal pulse generating unit 200, and then the pulse width of the column selection signal is determined by using the signal having a larger pulse width.

As described above, in a column selection signal generator according to an embodiment of the present invention, a pulse width of an internally generated pulse signal is compared with that of a pulse signal generated by an external clock signal, and the column selection signal is outputted using the pulse signal having a larger pulse width. As a result, a predetermined pulse width of the column selection signal is maintained even when external conditions are changed like process change, thereby stably operating a semiconductor memory device.

The foregoing description of various embodiments of the invention has been presented for purposes of illustration and description. It is not intended to be exhaustive or to limit the invention to the precise form disclosed, and modifications and variations are possible in light of the above teachings or may be acquired from practice of the invention. Thus, the embodiments were chosen and described in order to explain the principles of the invention and its practical application to enable one skilled in the art to utilize the invention in various embodiments and with various modifications as are suited to the particular use contemplated.

What is claimed is:

1. A column selection signal generator of a semiconductor memory device, comprising:
   a command combination unit for logically combining a plurality of command signals in response to an external clock signal to generate a first pulse signal;
   a pulse generating unit for generating a second pulse signal in response to the first pulse signal;

a comparison unit for comparing a pulse width of the first pulse signal with that of the second pulse signal to output a column selection signal in response to the comparison result; and a selection unit for selectively outputting one of output signals from the comparison unit and the pulse generating unit;

wherein the comparison unit outputs the first pulse signal as the column selection signal when a clock period (tCK) is long, and the second pulse signal as the column selection signal when the clock period (tCK) is short.

2. The column selection signal generator according to claim 1, wherein the comparison unit selects one having a larger pulse width of the first pulse signal and the second pulse signal to output the column selection signal.

3. The column selection signal generator according to claim 1, wherein the comparison unit comprises a logic operation unit for comparing a pulse width of the first pulse signal with that of the second pulse signal.

4. The column selection signal generator according to claim 3, wherein the logic operation unit is a NOR gate.

5. The column selection signal generator according to claim 1, wherein the command combination unit comprises:

a plurality of inverters for inverting the plurality of command signals; and a logic operation unit for logically combining an output signal from the plurality of inverters.

6. The column selecting signal generator according to claim 5, wherein the logic operation unit is a NAND gate.

7. The column selecting signal generator according to claim 1, wherein the selection unit comprises a metal option switching element.

* * * * *